United States Patent
Tsai et al.

(10) Patent No.: US 10,276,715 B2
(45) Date of Patent: Apr. 30, 2019

(54) FIN FIELD EFFECT TRANSISTOR AND METHOD FOR FABRICATING THE SAME

(71) Applicant: Taiwan Semiconductor Manufacturing Co., Ltd., Hsinchu (TW)

(72) Inventors: Chun Hsiung Tsai, Hsinchu County (TW); Chien-Tai Chan, Hsinchu (TW); Kuo-Feng Yu, Hsinchu County (TW); Kei-Wei Chen, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 123 days.

(21) Appl. No.: 15/054,104

(22) Filed: Feb. 25, 2016

(65) Prior Publication Data

US 2017/0250278 A1 Aug. 31, 2017

(51) Int. Cl.
*H01L 29/76* (2006.01)
*H01L 29/78* (2006.01)
*H01L 29/66* (2006.01)
*H01L 21/306* (2006.01)

(52) U.S. Cl.
CPC .... *H01L 29/7833* (2013.01); *H01L 21/30608* (2013.01); *H01L 29/6656* (2013.01); *H01L 29/66795* (2013.01); *H01L 29/66803* (2013.01); *H01L 29/785* (2013.01); *H01L 29/7848* (2013.01); *H01L 29/7851* (2013.01)

(58) Field of Classification Search
CPC ............. H01L 29/7848; H01L 29/7851; H01L 29/6656; H01L 29/66795; H01L 21/30608; H01L 21/823412; H01L 21/823807; H01L 29/78621–29/78633; H01L 29/7833–29/7836; H01L 29/7855–29/7856; H01L 2029/7858; H01L 29/41791

USPC ........ 438/152, 153, 154, 218; 257/350, 369, 257/401, 408

See application file for complete search history.

(56) References Cited

U.S. PATENT DOCUMENTS

| | | | | |
|---|---|---|---|---|
| 7,736,956 B2* | 6/2010 | Datta | ................ | H01L 21/28114 438/151 |
| 8,293,616 B2* | 10/2012 | Chang | ............... | H01L 21/82387 257/E21.564 |
| 9,362,405 B1* | 6/2016 | Jacob | .................. | H01L 29/7851 |
| 2005/0272192 A1* | 12/2005 | Oh | ..................... | H01L 29/66553 438/197 |
| 2006/0170053 A1* | 8/2006 | Yeo | ........................ | H01L 21/84 257/353 |
| 2011/0147828 A1* | 6/2011 | Murthy | ............. | H01L 21/02057 257/327 |

(Continued)

*Primary Examiner* — Kevin M Picardat
(74) *Attorney, Agent, or Firm* — JCIPRNET

(57) ABSTRACT

A fin field effect transistor (FinFET) is provided. The FinFET includes a substrate, a gate stack, and strained source and drain regions. The substrate has a semiconductor fin. The gate stack is disposed across the semiconductor fin. Moreover, the strained source and drain regions are located within recesses of the semiconductor fin beside the gate stack. Moreover, at least one of the strained source and drain regions has a top portion and a bottom portion, the bottom portion is connected to the top portion, and a bottom width of the top portion is greater than a top width of the bottom portion.

18 Claims, 6 Drawing Sheets

(56) References Cited

U.S. PATENT DOCUMENTS

| | | | |
|---|---|---|---|
| 2011/0287600 A1* | 11/2011 | Cheng | H01L 21/02639 |
| | | | 438/299 |
| 2013/0248948 A1* | 9/2013 | Ma | H01L 29/66636 |
| | | | 257/288 |
| 2014/0127893 A1* | 5/2014 | Huang | H01L 29/6653 |
| | | | 438/590 |
| 2014/0141589 A1* | 5/2014 | Shin | H01L 29/66568 |
| | | | 438/306 |
| 2014/0346600 A1* | 11/2014 | Cheng | H01L 29/7849 |
| | | | 257/347 |
| 2016/0005863 A1* | 1/2016 | Kuang | H01L 21/30604 |
| | | | 257/190 |
| 2016/0093740 A1* | 3/2016 | Harley | H01L 29/7851 |
| | | | 257/347 |

* cited by examiner

FIN FIELD EFFECT TRANSISTOR AND METHOD FOR FABRICATING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of forming FinFET devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
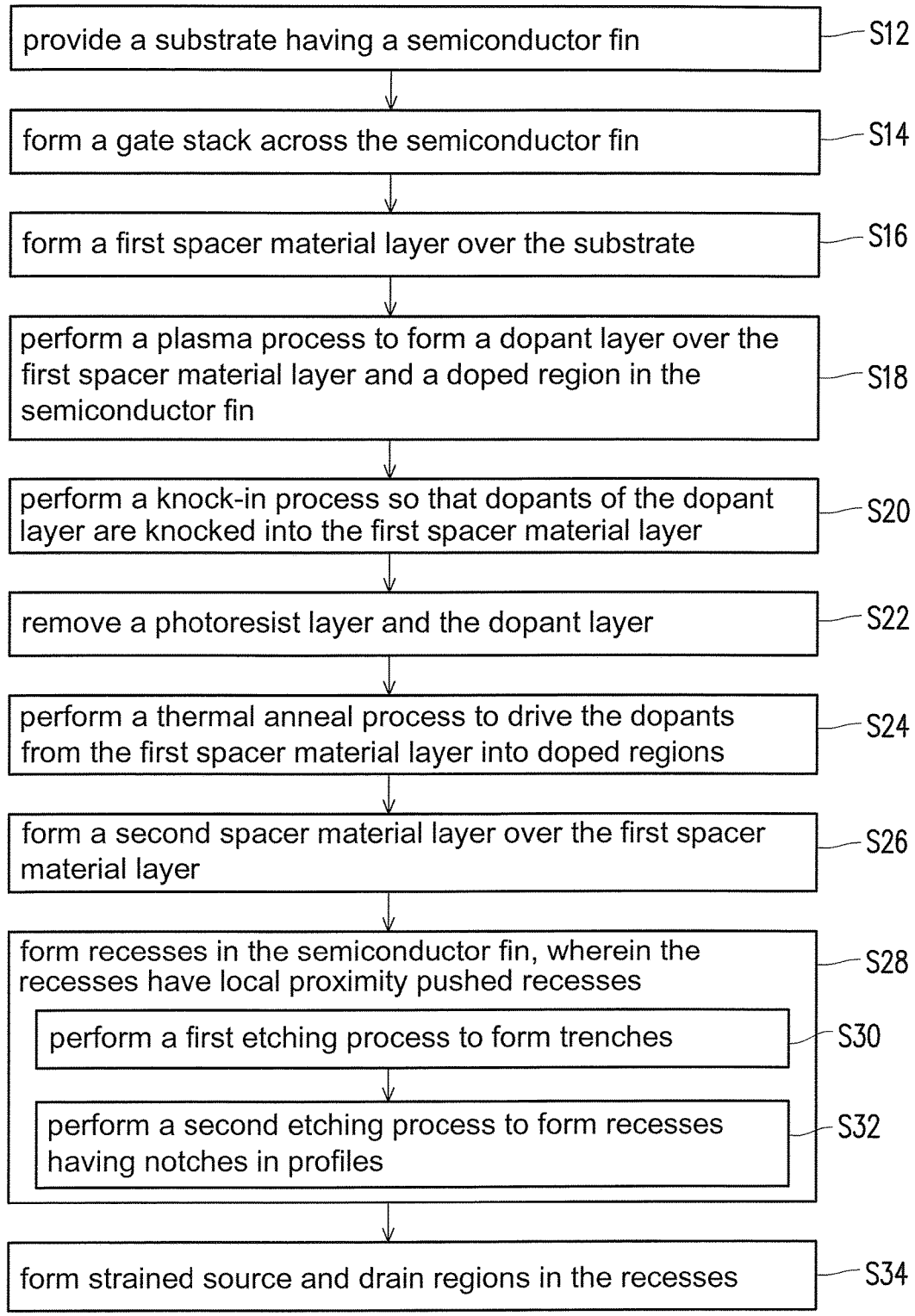
FIG. 1 is a flow chart illustrating a method for fabricating a FinFET in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 4:
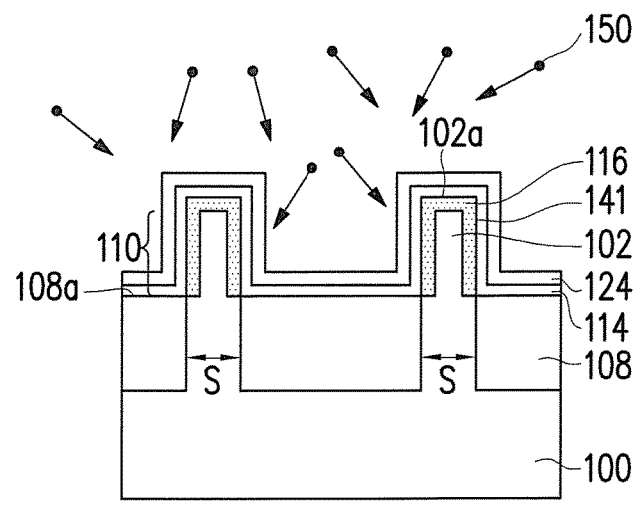
FIG. 4 shows doped regions formed in the semiconductor fins by using a plasma doping process in accordance with some embodiments.
Figure 5:
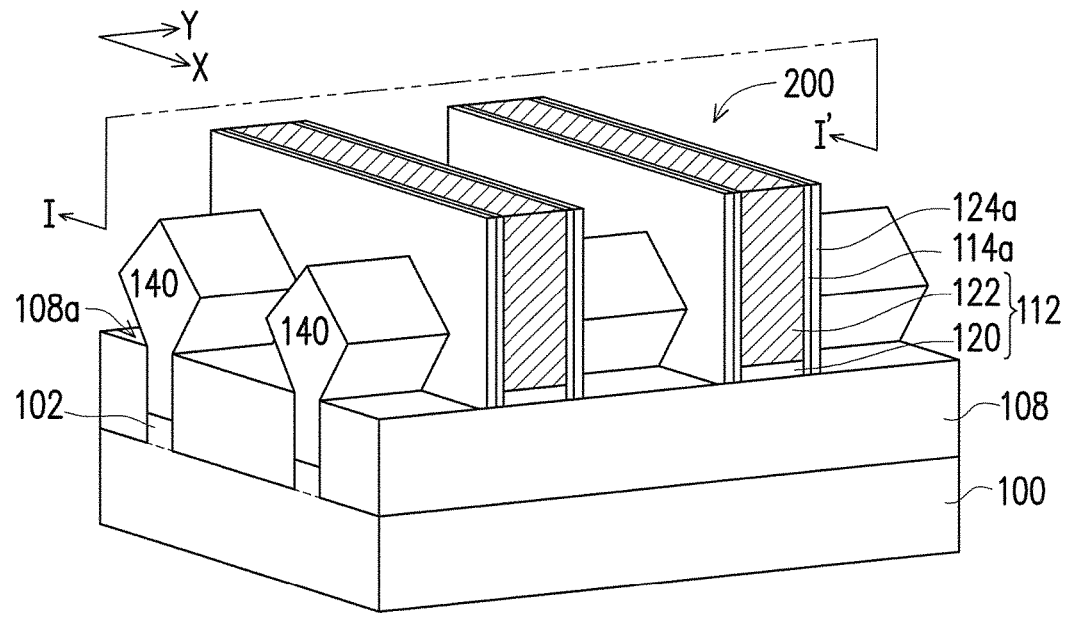
FIG. 5 is a view illustrating a FinFET in accordance with some embodiments.

FIG. 1 is a flow chart illustrating a method for fabricating a FinFET in accordance with some embodiments. FIGS. 2A to 2G are perspective views of a method for fabricating a FinFET in accordance with some embodiments. FIG. 4 shows doped regions formed in the semiconductor fins by using a plasma doping process in accordance with some embodiments. FIG. 5 is a view illustrating a FinFET in accordance with some embodiments. In other words, FIGS. 2A to 2G are cross-sectional view corresponding to the method for fabricating the FinFET taken along the line I-I' of FIG. 5, and FIG. 4 is another cross-sectional view corresponding to the method for fabricating the FinFET shown in FIG. 2B.

Figure 2A:
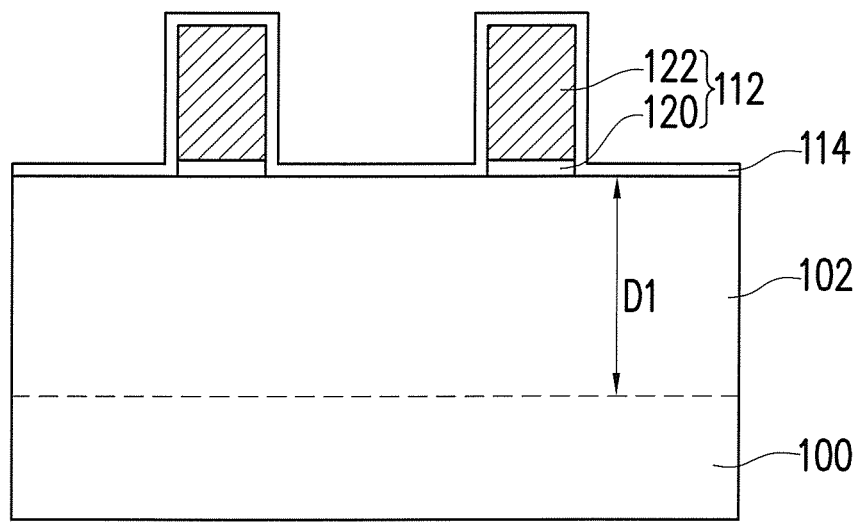
FIGS. 2A to 2G are cross-sectional views of a method for fabricating a FinFET in accordance with some embodiments.

At Step 12 in FIG. 1 and as shown in FIG. 2A and FIG. 5, a substrate 100 is provided. The substrate 100 includes a bulk substrate, a silicon-on-insulator (SOI) substrate or a germanium-on-insulator (GOI) substrate, for example. In one embodiment, the substrate 100 includes a crystalline silicon substrate (e.g., wafer). The substrate 100 may include various doped regions depending on design requirements (e.g., p-type substrate or n-type substrate). In some embodiments, the doped regions may be doped with p-type or n-type dopants. For example, the doped regions may be doped with p-type dopants, such as boron or $BF_2^+$, n-type dopants, such as phosphorus or arsenic, and/or a combination thereof. The doped regions may be configured for an n-type FinFET, or alternatively configured for a p-type FinFET. In some alternative embodiments, the substrate 100 may be made of some other suitable elemental semiconductors, such as diamond or germanium, a suitable compound semiconductor, such as gallium arsenide, silicon carbide, indium arsenide, or indium phosphide, or a suitable alloy semiconductor, such as silicon germanium carbide, gallium arsenic phosphide, or gallium indium phosphide. Also, in some embodiments, the substrate 100 may include other conductive layers or other semiconductor elements, such as transistors, diodes or the like.

As shown in FIG. 2A, FIG. 4 and FIG. 5, the substrate 100 has semiconductor fins 102 and isolation structures 108. The semiconductor fins 102 are formed of a material the same as or different from a material of the substrate 100. In some embodiments, a depth D1 of the semiconductor fins 102 ranges from 40 nm to 55 nm. The isolation structures 108 include silicon oxide, silicon nitride, silicon oxynitride, a spin-on dielectric material, a low-k dielectric material, or a combination thereof and formed by performing a high-density-plasma chemical vapor deposition (HDP-CVD) process, a sub-atmospheric CVD (SACVD) process or a spin-on process, for example.

As shown in FIG. 2A, FIG. 4 and FIG. 5, in some embodiments, the semiconductor fins 102 are formed by forming trenches, forming (or forming) shallow trench isolation (STI) regions in the trenches, and lowering a top surface of STI regions by performing an etching process to a level lower than an original top surface of the substrate 100. The remaining portions of the STI regions become the isolation structures 108, and the remaining portions of the substrate 100 between the isolation structures 108 thus become the semiconductor fins 102. Top surfaces 108a of the isolation structures 108 are lower than top surfaces 102a of the semiconductor fins 102. In other words, top portions 110 of the semiconductor fins 102 protrude from the top surfaces 108a of the isolation structures 108. Further, two adjacent isolation structures 108 are spaced apart by a spacing S. For example, the spacing S between the isolation structures 108 may be smaller than about 30 nm. In other words, two adjacent isolation structures 108 are spaced apart by the corresponding semiconductor fin 102.

In some other embodiments, the semiconductor fins 102 are formed of a material different from that of the substrate 100. The semiconductor fins 102 may be formed by lowering top portions of the substrate 100 between the adjacent isolation structures 108 to form the recesses, and re-growing a semiconductor material different from that of substrate 100 in the recesses. Top portions of the STI regions may then be removed by performing a chemical mechanical polish process and an etching process, while bottom portions of the STI regions are not removed. As a result, the remaining portions of STI regions become the isolation structures 108, and the top portions of the re-grown semiconductor material between the adjacent isolation structures 108 become the semiconductor fins 102.

At Step S14 in FIG. 1 and as shown in FIG. 2A and FIG. 5, at least one gate stack 112 is formed across the semiconductor fins 102 and the isolation structures 108. In one embodiment, an extending direction X of the gate stack 112 is, for example, perpendicular to an extension direction Y of the semiconductor fins 102, so as to cover middle portions of the semiconductor fins 102. The middle portions may act as channels of a tri-gate FinFET. In some embodiments, the gate stack 112 includes a gate dielectric layer 120 and a gate electrode 122. In alternative embodiments, the gate structure 112 may further include an interfacial layer (IL) on the semiconductor fins 102. In other words, the gate dielectric layer 120 is formed between the IL and the gate electrode 122. In some embodiments, the IL includes a dielectric material, such as silicon oxide or silicon oxynitride. The IL is formed by performing a thermal oxidation process, a chemical vapor deposition (CVD) process, or an atomic layer deposition (ALD) process.

The gate dielectric layer 120 is formed to cover the middle portions (also referred as first portions) of the semiconductor fins 102 and portions of the isolation structures 108. In some embodiments, the gate dielectric layer 120 includes silicon oxide, silicon nitride, silicon oxynitride, high-k dielectric materials, or a combination thereof. The high-k dielectric materials are generally dielectric materials with a dielectric constant higher than 4. The high-k dielectric materials include metal oxide. In some embodiments, examples of the metal oxide used as the high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or a combination thereof. The gate dielectric layer 120 is formed by performing a thermal oxidation process, a CVD process, an ALD process, or a combination thereof.

The gate electrode 122 is formed on the gate dielectric layer 120. In some embodiments, the gate electrode 122 is a polysilicon gate structure or a replacement metal gate structure. A material of gate electrode 122 includes doped or undoped polysilicon or a metal-containing conductive material. The metal-containing conductive material includes a barrier, a work function layer, a seed layer, an adhesion layer, a barrier layer, or a combination thereof. The metal-containing conductive material includes Al, Cu, W, Ti, Ta, Ag, Ru, Mn, Zr, TiAl, TiN, TaN, WN, TiAlN, TaN, TaC, TaCN, TaSiN, NiSi, CoSi, or a combination thereof, for example. In some embodiments, the gate electrode 122 includes metal-containing conductive materials suitable for a PMOS device, such as TiN, WN, TaN, or Ru. In some alternative embodiments, the gate electrode 122 includes metal-containing conductive materials suitable for an NMOS device, such as Ti, Ag, Al, TiAl, TiAlN, TaC, TaCN, TaSiN, Mn, or Zr. The gate electrode 122 may be formed by performing a suitable process such as an ALD process, a CVD process, a PVD process, a plating process, or a combination thereof. In some embodiments, a width of the gate electrode 122 is about 15 nm to 25 nm, a pitch between the adjacent gate electrodes 122 is in a range from 45 nm to 100 nm.

At Step S16 in FIG. 1 and as shown in FIG. 2A and FIG. 4, a first spacer material layer 114 is formed over the substrate. The first spacer material layer 114 is formed of dielectric materials, such as silicon oxide, silicon nitride, SiCN, high-k dielectric materials (such as SiCON), or a combination thereof. The first spacer material layer 114 may be formed by performing a suitable process such as an ALD process, a CVD process, or a combination thereof. A thickness of the first spacer material layer 114 ranges from about 1 nm to about 5 nm.

Figure 3:
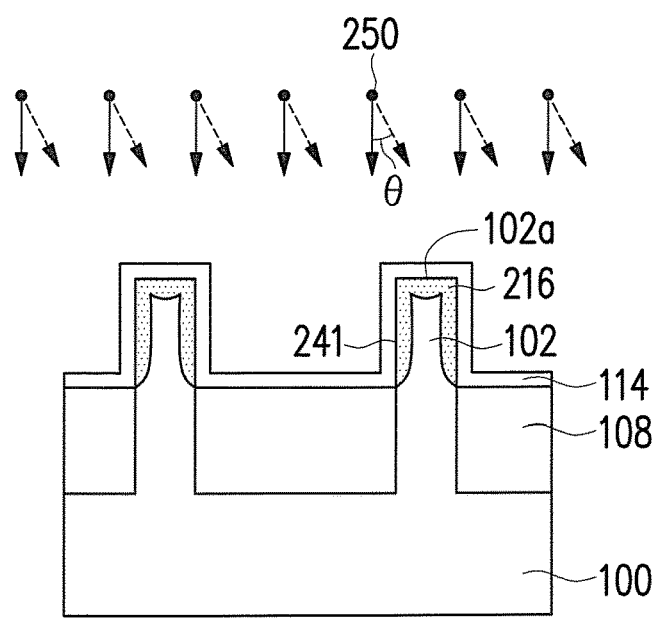
FIG. 3 shows doped regions formed in the semiconductor fins by using an ion implantation process in accordance with some embodiments.

After the first spacer material layer 114 is formed, the substrate 100 undergoes an additional substrate treatment to form FET devices. A process to form the FET devices includes doping the semiconductor fins 102 to form lightly doped source and drain (LDD) regions. In some embodiments, the LDD regions are formed by performing an ion implantation with the assistance of ion beams. FIG. 3 shows N-type dopant ions 250, such as phosphorus ions or arsenic ions, that are directed toward the substrate 100 and implanted into the semiconductor fins 102 to form doped regions 216, in accordance with some embodiments. The dopants, which are ions, may be directed toward the substrate 100 vertically, or in a direction inclined toward sidewalls of the semiconductor fins 102 at an angle "θ". Due to a shadowing effect, dopant profiles of the doped regions 216 are not uniform beneath outer profiles 241 (denoted with bold lines) of the semiconductor fins 102 respectively. Such uneven dopant profiles of the doped regions 216 and other similar regions are more pronounced in advanced device technologies with high aspect ratios in the spaces between semiconductor fins. The uneven dopant profiles may be maintained after dopant diffusion and result in variation in device performance within a die (WID). Further, for the advanced device technologies, such as technology nodes below 90 nanometers (nm), a junction depth less than about 25 nm may be needed. For example, a shallow junction depth is adapted in FinFET (fin field effect transistor) structures with high aspect ratios, such as an aspect ratio equal to or greater than about 1.3 for 22 nm technology nodes, in accordance with some embodiments. Doping by using ion beams fails to meet the requirement of shallow junction depth due to a relatively high energy of ion beams. As a result, a new doping mechanism is needed.

Figure 2B:
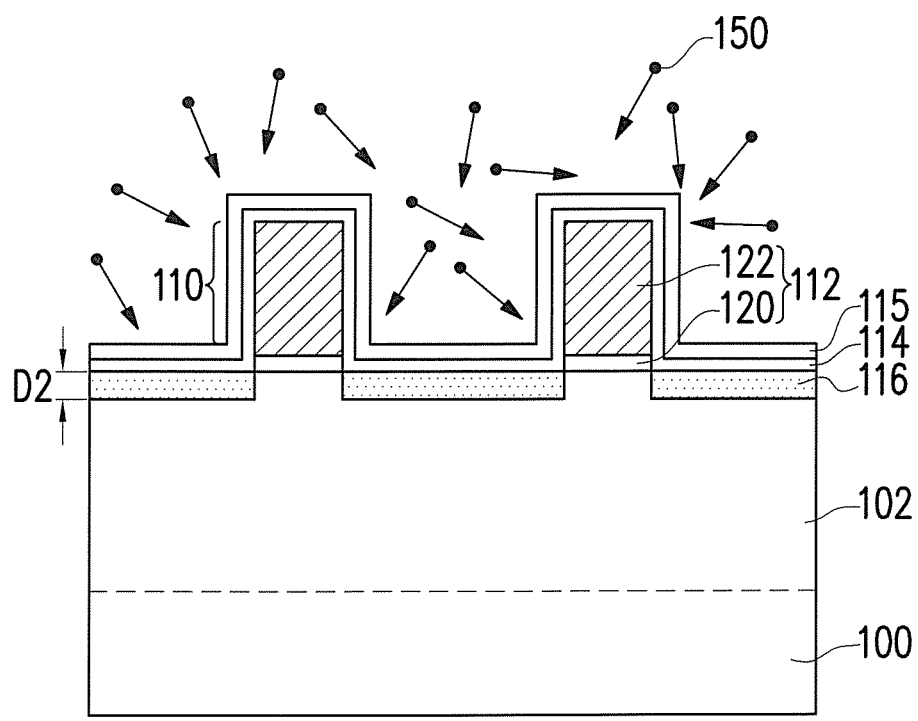

At Step S18 in FIG. 1 and as shown in FIG. 2B and FIG. 4, before a dopant layer 115 is formed, a photoresist layer (not shown) is formed in a p-type FinFET region (not shown) of the substrate 100. Thereafter, the dopant layer 115 is formed on the first spacer material layer 114 and doped regions 116 are formed in the semiconductor fins 102. In some embodiments, the dopant layer 115 and the doped regions 116 are formed at the same time by performing a "plasma doping" (PLAD) process. In other words, the PLAD process includes a deposition process and a direct doping process. The deposition process is performed to form a film on the first spacer material layer 114. In some embodiments, the film is less than ten monolayers thick, although other thicknesses may be set. At the same time, the direct doping process is performed, so that the film and the semiconductor fins 102 are doped to form the dopant layer 115 and the doped regions 116. In some embodiment, n-type dopant ions 150, such as phosphorus ions or arsenic ions, in a plasma sheath (whose boundary is not shown) right above the surface of the film are directed toward the film to dope the film and thereby form the dopant layer 115. At the same time, the n-type dopant ions 150 may also directly penetrate the dopant layer 115 to partially dope the semiconductor fins 102 and thus form the doped regions 116 in the semiconductor fins 102.

A doping gas used in the plasma doping process is a reactant gas mixture including a dopant source and a carrier (a dilution gas). In some embodiment, the reactant gas mixture includes about 5% $As_2H_3$ and about 95% carrier. In some embodiments, the reactant gas mixture includes about 1% to about 10% $As_2H_3$ and about 90% to about 99% carrier. A flow rate of $As_2H_3$ is in a range from about 50 sccm to about 150 sccm. The carrier gas includes at least one element selected from the group consisting of argon (Ar), neon (Ne), helium (He), hydrogen (H), Krypton (Kr), and Xenon (Xe). In some embodiment, the carrier includes about 30% H2 and about 70% Xe. A pressure of the plasma process is in a range from about 5 mTorr to 30 mTorr, and a doping/implant energy used for the plasma process is in a range from about 1 KeV to about 3 KeV.

As shown in FIGS. 2B and FIG. 4, the dopant plasma ions 150 arrive at the substrate surface at a range of angles, instead of being at a fixed angle as in the case of ion beam implantation. Due to the range of arriving angles of the plasma ions, the doped regions 116 are more uniform beneath the outer profiles 141 of the semiconductor fins 102. Since the plasma ions have a lower energy than that of the ions of ion beams, a shallow junction depth (such as less than about 25 nm) can be achieved. In some embodiment, a depth D2 of the doped regions 116 ranges from about 2 nm to about 12 nm. In some embodiments, a doping concentration of the doped region 116 is in a range from about $1\times10^{19}/cm^3$ to about $5\times10^{20}/cm^3$.

Figure 2C:
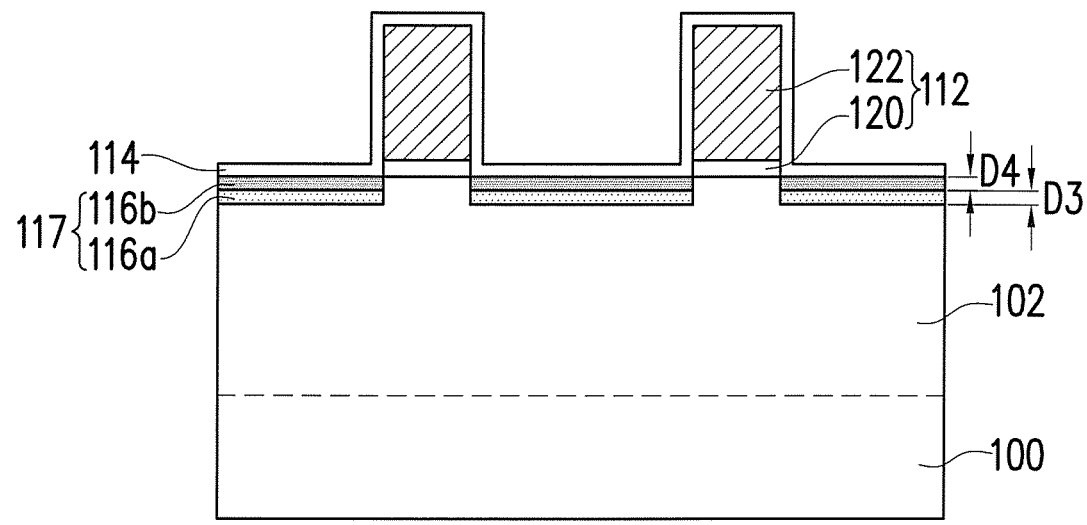

At Step S20 in FIG. 1 and as shown in FIG. 2B and FIG. 2C, a knock-in process is performed so that dopants of the dopant layer 115 are knocked into the first spacer material layer 114. In some embodiments, the knock-in process may be performed by using one selected from the group consisting of argon (Ar), neon (Ne), helium (He), hydrogen (H), Krypton (Kr), and Xenon (Xe).

At Step S22 in FIG. 1 and as shown in FIG. 2B and FIG. 2C, in some embodiment, after the knock-in process is performed, a photoresist layer 126 is removed by using a high-temperature sulfuric acid-hydrogen peroxide mixture (HTSPM) cleaning solution (e.g. $H_2SO_4$.$H_2O_2$ is 4:1 by volume). At the same time, the dopant layer 115 is removed.

At Step S24 in FIG. 1 and as shown in FIG. 2C, a thermal anneal process is performed to drive the dopants from the first spacer material layer 114 into a top portion of the doped regions 116, so as to form a top region 116b. A bottom region 116a of the doped regions 116 has few or no dopants derived from the first spacer material layer 114. The thermal anneal process is performed by a rapid thermal anneal (RTA) process at a temperature between about 800° C. to about 1100° C. After the thermal anneal process is performed, the LDD regions 117 are formed.

More specifically, at least one of the LDD regions 117 includes the bottom region 116a and the top region 116b. The bottom region 116a is formed by performing the direct doping process, and the top region 116b is formed by performing the knock-in process and the thermal anneal process after the direct doping process. Thus, a doping concentration of the top region 116b is higher than a doping concentration of the bottom region 116a. In some embodiments, the doping concentration of the bottom region 116a is in a range from about $1\times10^{17}/cm^3$ to about $5\times10^{18}/cm^3$, and the doping concentration of the top region 116b is in a range from about $1\times10^{19}/cm^3$ to about $5\times10^{20}/cm^3$. In some embodiments, a depth D4 of the top region 116b is in a range from about 2 nm to 6 nm; and a depth D3 of the bottom region 116a is in a range from about 2 nm to 6 nm.

Figure 2D:
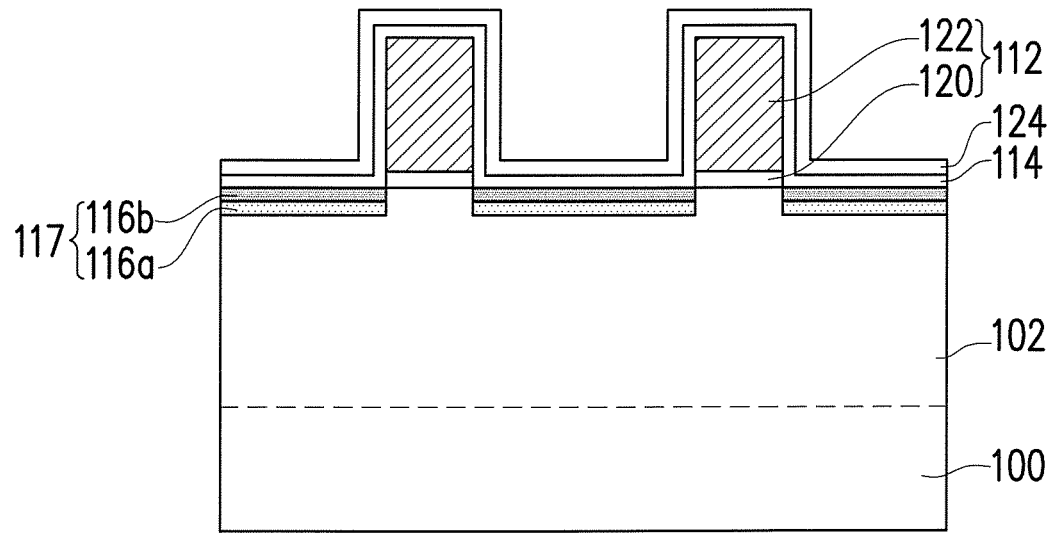

At Step S26 in FIG. 1 and as shown in FIG. 2D, a second spacer material layer 124 is formed over the substrate 100. A material of the second spacer material layer 124 is different from that of the first spacer material layer 114. The second spacer material layer 124 is formed of dielectric materials, such as silicon oxide, silicon nitride, SiCN, high-k dielectric materials (such as SiCON), or a combination thereof. The second spacer material layer 124 may be a single-layer or a multi-layer structure. In an embodiment, the second spacer material layer 124 includes an offset spacer material and a dummy spacer material layer. The second spacer material layer 124 may be formed by performing a suitable process such as an ALD process, a CVD process, or a combination thereof. A thickness of the second spacer material layer 124 ranges from 1 nm to 5 nm.

Figure 2E:
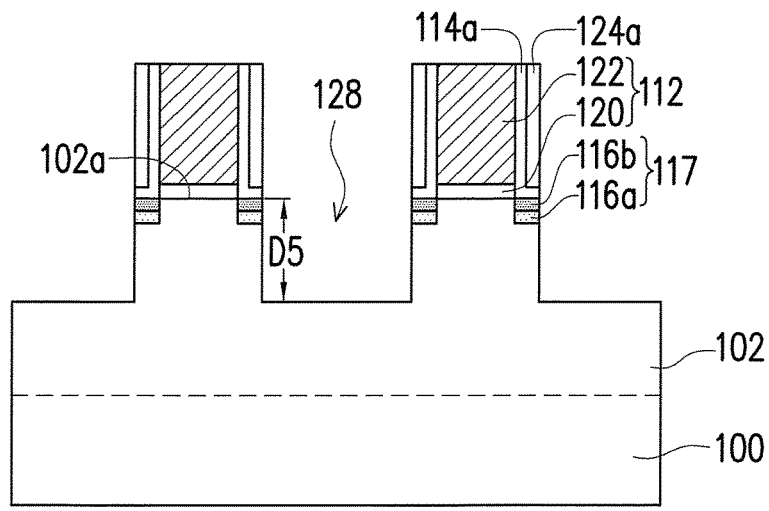
Figure 2F:
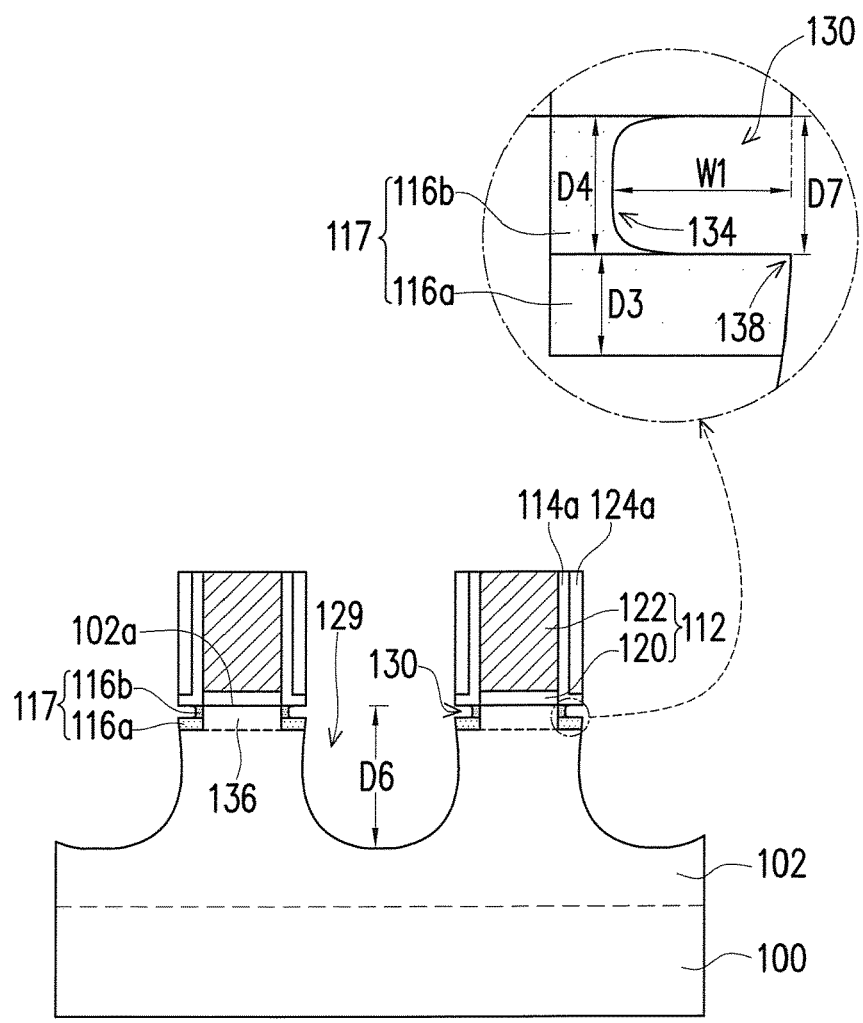

At Step S28 in FIG. 1 and as shown in FIG. 2F, recesses 129 are formed within the semiconductor fins 102 beside the gate stacks 112 by removing a portion of the semiconductor fins 102 at locations intended for source and drain regions. The recesses 129 are formed by performing one or more etching processes. The etching process includes an anisotropic etching process, an isotropic etching process, or the combination thereof.

At Steps S30 to S34 in FIG. 1, in some embodiments, the formation of the recesses 129 includes performing a first etching process including a trench etching process and a second etching process including a local proximity push process. In some embodiments, the first etching process includes one or more anisotropic etching processes, and the second etching process includes one or more isotropic etching processes.

At Step S30 in FIG. 1 and as shown in FIG. 2D and FIG. 2E, the second spacer material layer 124, the first spacer material layer 114, the semiconductor fins 102 are etched downward in the first etching process (such as one or more isotropic etching processes) for a depth D5 (from the top surface 102a of the semiconductor fins 102), so that second spacers 124a and first spacers 114a are formed at sidewalls of the gate stacks 112, and trenches 128 are formed in the semiconductor fins 102. The depth D5 is greater than 60 nanometers and may range from 70 nanometers to 80 nanometers, for example. The first etching process includes one or more anisotropic etching processes, for example.

At Step S32 in FIG. 1 and as shown in FIG. 2E and FIG. 2F, following the first etching process, the second etching process is performed to further remove the semiconductor fins 102 to the extent of a depth D6 (from the top surface 102a of the semiconductor fins 102), so that recesses 129 are formed in the semiconductor fins 102. In some embodiments, a ratio of the depth D5 to the depth of the D6 is in a range form 60% to 90%.

During the second etching process, sidewalls and bottoms of the trenches 128 are etched to form bottom portions of the recesses 129. The bottom portions of recesses 129 have hemispherical profiles, semi-elliptical profiles, or bulb-like profiles.

Further, during the second etching process, an etching rate of the top regions 116b of the LDD regions 117 is higher than an etching rate of the bottom portions 116a of the LDD regions 117 and higher than an etching rate of the semiconductor fins 102. Thus, the top regions 116b of the LDD regions 117 are laterally etched to widen upper edges of the trenches 128 and thus form local proximity pushed recesses 130 (top portions of the recesses 129). The second etching process is controlled to laterally remove the top regions 116b of the LDD regions 117 under the second spacers 124a and the first spacers 114a so that sides 134 of the local proximity pushed recesses 130 extend toward a channel region 136 under the gate stack 112 and outspread below the second spacers 124a and the first spacers 114a. The local proximity pushed recesses 130 have rectangle profiles or ear-like profiles. In other words, the recesses 129 have notches 138 in profiles, and the bottom regions 116a of the LDD regions 117 cover the notches 138. A width W1 of the local proximity push recesses 130 is in a range from about 2 nm to about 6 nm, a depth D7 of the local proximity push recesses 130 is in a range from about 2 nm to about 6 nm.

The second etching process includes one or more isotropic etching processes. In some embodiments, the isotropic etching process is performed by using an etching gas containing halogen (F, Cl or Br). In some embodiments, the etching gas includes hydrogen chloride (HCl), HF, HBr and/or carbon fluoride ($C_xF_y$, wherein x and y are greater than zero), or other suitable etching gases or a combination thereof. A flow rate of the etching gas, a pressure and/or an etching temperature of the second etching process are adjustable to control the etching of the semiconductor fins 102 so as not to extend beyond the gate stack(s).

Figure 2G:
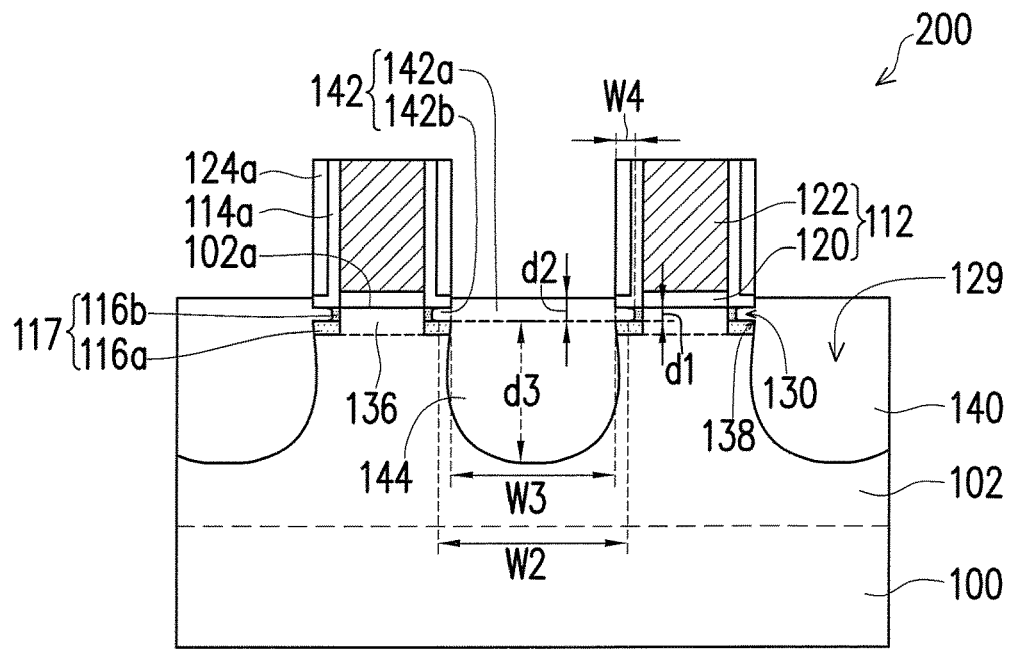

At Step S34 in FIG. 1 and as shown in FIG. 2F and FIG. 2G, strained source and drain regions 140 are formed in the recesses 129 of the semiconductor fins 102 and extend beyond the top surfaces 108a of the isolation structures 108 to strain or stress on the semiconductor fins 102. The strained source and drain regions 140 are formed at sides of the gate stack 112. A lattice constant of the strained source and drain regions 120 is different from a lattice constant of the substrate 100, and portions of the semiconductor fins 102 covered by the gate stack 112 are strained or stressed to enhance carrier mobility and performance of the FinFET. In one embodiment, the strained source and drain regions 140, such as silicon carbon (SiC) or silicon phosphide (SiP), is utilized for electron mobility enhancement of an n-type FinFET. In some embodiments, the strained source and drain regions 140 are formed through epitaxial growth. In some embodiments, the epitaxial growth technology includes performing a low pressure CVD (LPCVD) process, an atomic layer CVD (ALCVD) process, an ultrahigh vacuum CVD (UHVCVD) process, a reduced pressure CVD (RPCVD) process, a molecular beam epitaxy (MBE) process, a metalorganic vapor phase epitaxy (MOVPE) process or a combination thereof. Alternatively, the epitaxial growth technology utilizes a cyclic deposition-etch (CDE) epitaxy process or a selective epitaxial growth (SEG) process to form the strained material of high crystal quality. In some embodiments, a material of the strained source and drain regions 140 comprises includes phosphorus or arsenic doped silicon carbon (SiC) or silicon phosphide (SiP) formed by selectively growing epitaxy by performing in-situ doping.

As shown in FIG. 2G and FIG. 5, a fin field effect transistor 200 includes the substrate 100 having the semiconductor fin 102, the gate stack 112, the LDD regions 117, and the strained source and drain regions 140. The gate stack 112 is disposed across the semiconductor fin 102. The strained source and drain regions 140 are located within the recesses 129 of the semiconductor fin 102 beside the gate stack 112. In some embodiments, the semiconductor fin 102 between the strained source and drain regions 140 has a multi-step structure. The strained source and drain regions 140 have top portions 142 and bottom portions 144. The bottom portions 144 are connected to the top portions 142. A bottom width W2 of the top portion 142 is greater than a top width W3 of the bottom portion 144.

In other words, at least one of the strained source and drain regions 140 includes the top portion 142 and the bottom portion 144. The top portion 142 has a body 142a and at least one local proximity push region 142b. The body 142a is located on the bottom portion 144 and not covered by the first spacers 114a and the second spacers 124a. In some embodiments, the body 142a has a rectangle profile. The local proximity push region 142b is located under the first spacers 114a the second spacers 124a or the combination thereof. The local proximity push region 142b is connected with the body 142a protrudes from the bottom portion 144, and is toward the channel region 136 under the gate stack 112. The local proximity push region 142b has a rectangle profile, for example. In some embodiments, a top corner and a bottom corner of the local proximity push region 142 are rounded. In alternative embodiments, the local proximity push region 142b has an ear-like profile. A width W4 of the local proximity push region 142b is in a range from about 2 nm to about 6 nm. A depth d1 of the local proximity push region 142b is in a range from about 2 nm to about 6 nm. A depth d2 of the top portion 142 is smaller than a depth d3 of the bottom portion 144. The bottom portion 144 has a hemispherical profile, a semi-elliptical profile, or a bulb-like profile. Because the bottom width W2 of the top portions 142 is greater than the top width W3 of the bottom portions 144, the strained source and drain regions 140 have notches 138 in profiles. The notches 138 are located at the bottom surface of the local proximity push regions 142b and sidewalls of the bottom portions 144 and are below the first spacers 114a or the second spacers 124a. The notches 138 have V-shapes, for example. In some embodiments, at least one of the strained source and drain regions 140 has a rotated p-shape profile, a rotated b-shape profile, a σ profile, a reversed Ω profile or a profile of a pot with two handles.

In some embodiment, a doping concentration of the strained source and drain regions 140 is higher than a doping concentration of the LDD regions 117. The LDD regions 117 include the top regions 116b and the bottom regions 116a. The doping concentration of the top regions 116b is higher than the doping concentration of the bottom regions 116a. The top regions 116b are located beside the local proximity push regions 142b. The bottom regions 116a are located below the local proximity push regions 142b and the sidewalls of the bottom portion 144. In alternative embodiments, the width W1 of the local proximity push recess 130 is greater so that the top regions 116b of the LDD regions 117 do not remain.

In some embodiments, the strained source and drain region includes the local proximity push regions. Because the local proximity push regions are formed in the top surface of the semiconductor fin, toward the channel region, and have a higher doping concentration than the doping concentration of the LDD region, a control of a short channel effect (SCE) is improved and the performance of the device is increased.

Further, by performing the PLAD process and the thermal process, the LDD region is formed to have the top region and the bottom region with different doping concentrations. Therefore, the top region having a higher doping concentration has the etching rate higher than that of the bottom region having a lower doping concentration. Consequently, the local proximity push recesses can be formed during the etching processes for forming the recesses where the strained source and drain regions are formed by filling the recesses.

In accordance with some embodiments of the present disclosure, a fin field effect transistor (FinFET) is provided. The FinFET includes a substrate, a gate stack, and strained source and drain regions. The substrate has a semiconductor fin. The gate stack is disposed across the semiconductor fin. Moreover, the strained source and drain regions are located within recesses of the semiconductor fin beside the gate stack. Moreover, at least one of the strained source and drain regions has a top portion and a bottom portion, the bottom portion is connected to the top portion, and a bottom width of the top portion is greater than a top width of the bottom portion.

In accordance with alternative embodiments of the present disclosure, a fin field effect transistor (FinFET) is provided. The FinFET includes a substrate, a gate stack, spacers, and strain source and drain regions. The substrate has a semiconductor fin. The gate stack is disposed across the semiconductor fin. The spacers are located on sidewalls of the gate stack. In addition, the strained source and drain regions are located within recesses of the semiconductor fin beside the gate stack. Moreover, at least one of the strained source and drain regions has at least one notch below the spacers.

In accordance with yet alternative embodiments of the present disclosure, a method for fabricating a fin field effect transistor (FinFET) is provided. First of all, a substrate having a semiconductor fin is provided. A gate stack is formed across the semiconductor fin. A first spacer material layer is formed over the substrate. A plasma doping process and a thermal anneal process are performed so as to form lightly doped source and drain (LDD) regions in the semiconductor fin beside the gate stack. A doping concentration of top regions of the LDD regions is higher than a doping concentration of bottom regions of the LDD regions. A second spacer material layer is formed over the first spacer material layer. A first etching process is performed to form trenches in the semiconductor fin beside the gate stack. A second etching process is performed to locally push the top regions of the LDD regions, so as to form recesses having notches in profiles. Strained source and drain regions are formed to fill in the recesses.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET), comprising:
a substrate having a semiconductor fin;
a gate stack disposed across the semiconductor fin;
lightly doped source and drain (LDD) regions beside the gate stack; and
strained source and drain regions located within recesses of the semiconductor fin beside the gate stack, wherein at least one of the strained source and drain regions has a top portion and a bottom portion, the bottom portion is connected to the top portion, and a bottom width of the top portion is greater than a top width of the bottom portion,
wherein the top portion has a body and a region, the body is located on the bottom portion, and the region is connected with the body, extends beyond a sidewall of the bottom portion and toward a channel region under the gate stack,
wherein at least one of the LDD regions is under the region and beside the bottom portion.

2. The FinFET of claim 1, wherein the region has a rectangle profile.

3. The FinFET of claim 1, wherein a top corner and a bottom corner of the region are rounded.

4. The FinFET of claim 1, wherein a width of the region is in a range from about 2 nm to about 6 nm.

5. The FinFET of claim 1, wherein a depth of the region is in a range from about 2 nm to about 6 nm.

6. The FinFET of claim 1, wherein the bottom portion has a hemispherical profile, a semi-elliptical profile, or a bulb-like profile.

7. The FinFET of claim 1, wherein the at least one of the strained source and drain regions has a rotated p-shape profile, a rotated b-shape profile, a σ profile, a reversed Ω profile.

8. The FinFET of claim 1, wherein a depth of the top portion is smaller than a depth of the bottom portion.

9. The FinFET of claim 1, further comprising spacers located on sidewalls of the gate stack, wherein the region is covered by one of the spacers.

10. The FinFET of claim 1, wherein a doping concentration of the top portion is higher than a doping concentration of the at least one of the LDD regions.

11. A fin field effect transistor (FinFET), comprising:
a substrate having a semiconductor fin;
a gate stack disposed across the semiconductor fin;
spacers located on sidewalls of the gate stack; and
strained source and drain located within recesses of the semiconductor fin beside the gate stack, wherein at least one of the strained source and drain has a region below the spacers and toward a channel region under the gate stack, and has at least one notch below the region, and the at least one notch is separated from the spacers by the region.

12. The FinFET of claim 11, wherein the at least one notch has a V-shape.

13. The FinFET of claim 11, further comprising lightly doped source and drain (LDD) regions beside the gate stack, wherein at least one of the LDD regions covers the notch.

14. The FinFET of claim 13, wherein a doping concentration of the at least one of the strained source and drain is higher than a doping concentration of the at least one of the LDD regions.

15. The FinFET of claim 11, wherein the semiconductor fin between the strained source and drain has a multi-step structure.

16. A method for fabricating a fin field effect transistor (FinFET), comprising:
   providing a substrate having a semiconductor fin;
   forming a gate stack across the semiconductor fin;
   forming a first spacer material layer over the substrate;
   performing a plasma doping process and a thermal anneal process so as to form lightly doped source and drain (LDD) regions in the semiconductor fin beside the gate stack, wherein a doping concentration of top regions of the LDD regions is higher than a doping concentration of bottom regions of the LDD regions;
   forming a second spacer material layer over the first spacer material layer;
   performing a first etching process to form trenches in the semiconductor fin beside the gate stack;
   performing a second etching process to locally push the top regions of the LDD regions, so as to form recesses having notches in profiles; and
   forming strained source and drain regions to fill in the recesses.

17. The method of claim 16,
   wherein the step of performing the plasma doping process comprises:
      forming a dopant layer on the first spacer material layer and forming a doped region in the semiconductor fin;
      performing a knock-in process so that dopants of the dopant layer are knocked into the first spacer material layer; and
      removing the dopant layer, and
   wherein the thermal anneal process is performed to drive the dopants in the first spacer material layer into the doped regions, so as to form the LDD regions.

18. The method of claim 17, wherein the second etching process comprises an isotropic etching process, and an etching rate of the top regions of the LDD regions is higher than an etching rate of the bottom portions of the LDD regions during the isotropic etching process.

* * * * *